United States Patent [19]
Haider

[11] Patent Number: 6,069,095
[45] Date of Patent: May 30, 2000

[54] ULTRA-CLEAN WAFER CHUCK ASSEMBLY FOR MOISTURE-SENSITIVE PROCESSES CONDUCTED IN RAPID THERMAL PROCESSORS

[75] Inventor: Asad M. Haider, Dallas, Tex.

[73] Assignee: Texas Instruments Incorporated, Dallas, Tex.

[21] Appl. No.: 09/137,853

[22] Filed: Aug. 21, 1998

Related U.S. Application Data

[60] Provisional application No. 60/057,344, Aug. 22, 1997.

[51] Int. Cl.$^7$ .................. H01L 21/26; H01L 21/336; H01L 21/44
[52] U.S. Cl. .................. 438/795; 438/308; 438/663
[58] Field of Search .................. 438/795, 308, 438/663

[56] References Cited

U.S. PATENT DOCUMENTS

| | | | |
|---|---|---|---|
| 4,910,155 | 3/1990 | Cote et al. ................................... | 437/8 |
| 5,830,277 | 11/1998 | Johnsgard et al. ...................... | 118/725 |
| 5,926,742 | 7/1999 | Thakur et al. ........................... | 438/795 |
| 5,993,916 | 11/1999 | Zhao et al. .............................. | 427/535 |
| 6,004,029 | 12/1999 | Moslehi et al. ............................. | 374/1 |

*Primary Examiner*—John F. Niebling
*Assistant Examiner*—Alexander G. Ghyka
*Attorney, Agent, or Firm*—Wade James Brady, III; Frederick J. Telecky, Jr.

[57] ABSTRACT

A method of thermal processing of semiconductor wafers during device fabrication wherein there is provided a processing chamber for thermal processing of a semiconductor wafer having a component-containing surface and an opposing backside. A retainer is provided for retaining the wafer within the chamber whereby the wafer, when retained by the retainer, forms an enclosed space in the chamber with the backside. A wafer is retained in the chamber with the retainer and the wafer is heated. Concurrent with the heating of the wafer, the fluid content of the enclosed space is continually removed while the wafer is in the processing chamber. The fluid content of the space which was the enclosed space is continually removed while the wafer is removed from the chamber after completion of the heating cycle thereon. The continual removal of fluid content can comprise purging the enclosed space with a moving gas inert to the materials in the chamber or the application of a vacuum to the enclosed space. The vacuum can be formed by providing a Venturi. A gas inert to the materials in the chamber is also passed over the component-containing surface.

17 Claims, 4 Drawing Sheets

ULTRA-CLEAN WAFER CHUCK ASSEMBLY FOR MOISTURE-SENSITIVE PROCESSES CONDUCTED IN RAPID THERMAL PROCESSORS

This application claims priority under 35 USC § 119(e)(1) of provisional application Ser. No. 60/057,344 filed Aug. 22, 1997.

BACKGROUND OF THE INVENTION

1. Field of the Invention

This invention relates to a method and system for maintaining the wafer environment clean during the fabrication of semiconductor devices.

2. Brief Description of Prior Art

In the fabrication of semiconductor devices, contact formation often involves the use of titanium with the formation of titanium silicide taking place. It is known that moisture is a deleterious impurity during titanium silicide formation and anneal processes due to the affinity of titanium for the oxygen with the rapid formation of titanium dioxide. This results in a substantial increase in sheet resistance through the titanium silicide formed. This is exemplified with reference to FIG. 1 which is a cross sectional view of a typical partially fabricated CMOS device having a titanium silicide contact 31 to the n+ moat region, a titanium silicide contact 33 to the p+ moat region and a pair of titanium silicide contacts 35, 37 which are the contacts to the polysilicon gates. High sheet resistance of these titanium silicide contacts will have a detrimental effect on electrical parameters and device speed. It has been found that when these processes are conducted in a rapid thermal processor (RTP), such as, for example, an Applied Materials' Centura RTP, moisture has been found to be present which has led to the above described deleterious effect. The source of this moisture was not determined in the prior art though the causes of such moisture content and/or the reasons for the above described deleterious effects were sought. A typical prior art RTP is shown in FIG. 2 wherein the wafer 1 is disposed in a holder 3 which rotates under a heating lamp 5. Nitrogen is passed over the wafer surface. Beneath the wafer 1 is a gold coated reflector plate 7 to reflect the heat back to the wafer having lift pins 9 which are used to lower or lift the wafer from the holder 3 at the beginning and end of the process. The reflector plate 7 also has embedded therein temperature sensors 11 to measure the temperature in the dead space 13 between the wafer 1 and the reflector plate.

SUMMARY OF THE INVENTION

It has now been determined in accordance with the present invention that the major source of moisture within the RTP chamber during actual processing as shown in FIG. 2 is the moisture desorbed from the wafer backside and retained in the dead space 13 after liftoff of the wafer 1 subsequent to thermal processing in the RTP. The moisture absorbed from the wafer backside becomes trapped between the wafer 1 and the reflector plate 7, which is generally gold plated. This trapped moisture is released into the process chamber when the wafer is lifted from the chuck at the end of the rapid thermal processing. Thus, the subsequent wafer entering the chamber can see a high moisture level left behind within the entire chamber including the chamber region between the wafer nd the heating lamp 5 from the prior wafer. This moisture buildup continues from wafer to wafer after the initial wafer is processed.

High levels of moisture in the process chamber result in the oxidation of titanium film at high processing temperatures. This causes very high sheet resistance, >12 ohms/square and poor film uniformity on the wafer with sheet resistance standard deviations >3 ohms/square. The effect of moisture level on titanium silicide sheet resistance and film uniformity is demonstrated by tests, the results of which are shown on four wafers as follows:

| Wafer | Moisture Level (ppm) | Sheet Resistance (ohms/sq.) |
| --- | --- | --- |
| 1 | 105 +/− 10 | 13.55 +/− 0.64 |
| 2 | 20 +/− 2 | 8.44 +/− 0.13 |
| 3 | 15 +/− 1 | 7.70 +/− 0.12 |
| 4 | 13 +/− 1 | 7.66 +/− 0.15 |

In, for example, the Centura RTP, the surface of the reflector plate is gold coated to maximize the reflected infra red light intensity that is supposed to uniformly heat the wafer backside while minimizing energy loss. The presence of trapped moisture molecules between the reflector plate and the wafer absorbs a part of this infra red energy which is essentially lost and this may also result in non-uniform wafer temperatures.

In accordance with the present invention and to solve the problem found in accordance with the present invention whereby moisture remained in the process chamber, the reflector plate assembly is modified and the moisture is removed from the dead volume formed between the reflector plate and the wafer.

Briefly, the above is accomplished by either (1) purging the dead volume with high purity nitrogen gas, (2) by soft pumping the dead volume and thereby pumping the moisture out, or (3) by a simultaneous soft pumping and purging.

Option (1) can be implemented by (a) having nitrogen flow in from around the wafer edge and then out from a separately built exhaust line in the bottom of the gold coated reflector or (b) by having both nitrogen inlet and outlet in the gold coated reflector plate below the wafer. In this case, gas flow rate will have to be controlled carefully so that the wafer does not get lifted up and dislodged from the centering ring due to the nitrogen pressure thereunder. This is particularly true when the wafer is spinning.

Option 2 is easier and more effective manner of getting rid of trapped moisture. This method also has the added advantages of better temperature uniformity on the wafer backside and less energy loss due to absorption of infra red by moisture and other gaseous species present in the dead volume. This option can be implemented by having either one or more holes drilled in the gold plated reflector plate beneath the wafer and then providing a soft vacuum line connection to these holes. Just a few inches of mercury (about 1 to about 3) vacuum is generally sufficient. Excessive vacuum is not desirable because it can pull the wafer down too hard and may result in problems during wafer lifting. If multiple holes are to be used in the reflector plate, which is desirable, then preferably the holes should be drilled such that they are radially symmetrical to keep optimal heat transfer conditions.

The necessary vacuum may also be created using the Venturi effect whereby high velocity gas, nitrogen, for example, is passed through the annular region of a concentric tubular outlet and a vacuum is created in the inner tube of the annulus. In this case, the inner tube of the annulus will have a connection to the inside of the dead volume that require being pumped out and the source of the high velocity gas could be the process nitrogen itself from the exhaust line.

Option 3 is merely any combination of options 1 and 2 as described above.

In accordance with the present invention, major moisture contamination is almost eliminated within the reactor, more uniform heating of the wafer backside is obtained and there is less energy loss due to infra red absorption by moisture molecules.

DESCRIPTION OF THE PREFERRED EMBODIMENTS

In accordance with the present invention and to solve the problem found in accordance with the present invention whereby moisture remained in the process chamber, the reflector plate assembly is modified and the moisture is removed from the dead volume formed between the reflector plate and the wafer.

Figure 3:
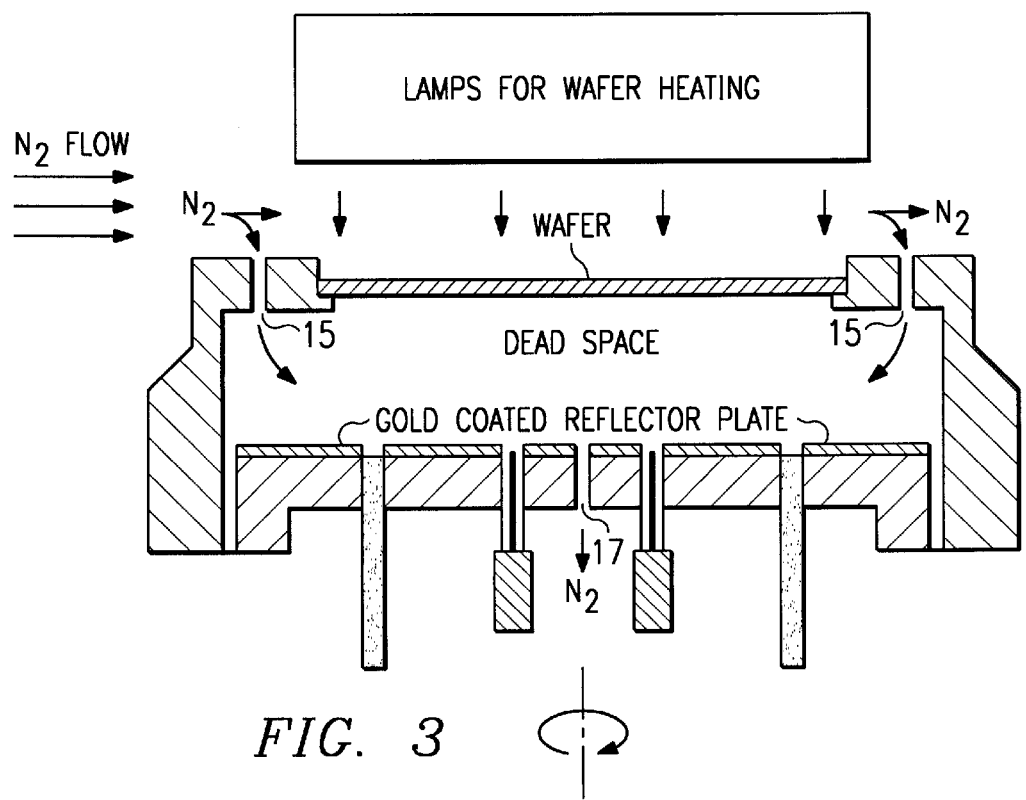
FIG. 3 is a schematic diagram in accordance with a first embodiment in accordance with the present invention.

Referring to FIG. 3 there is shown a first embodiment of the invention wherein the prior art RTP is modified so that the nitrogen stream passes over the wafer 1 as well as through an aperture 15 in the holder 3 to an exhaust 17 in the reflector 7. This causes a continual purging of the dead space 13, thereby removing any moisture which may have accumulated on the backside of the wafer 1.

Figure 1:
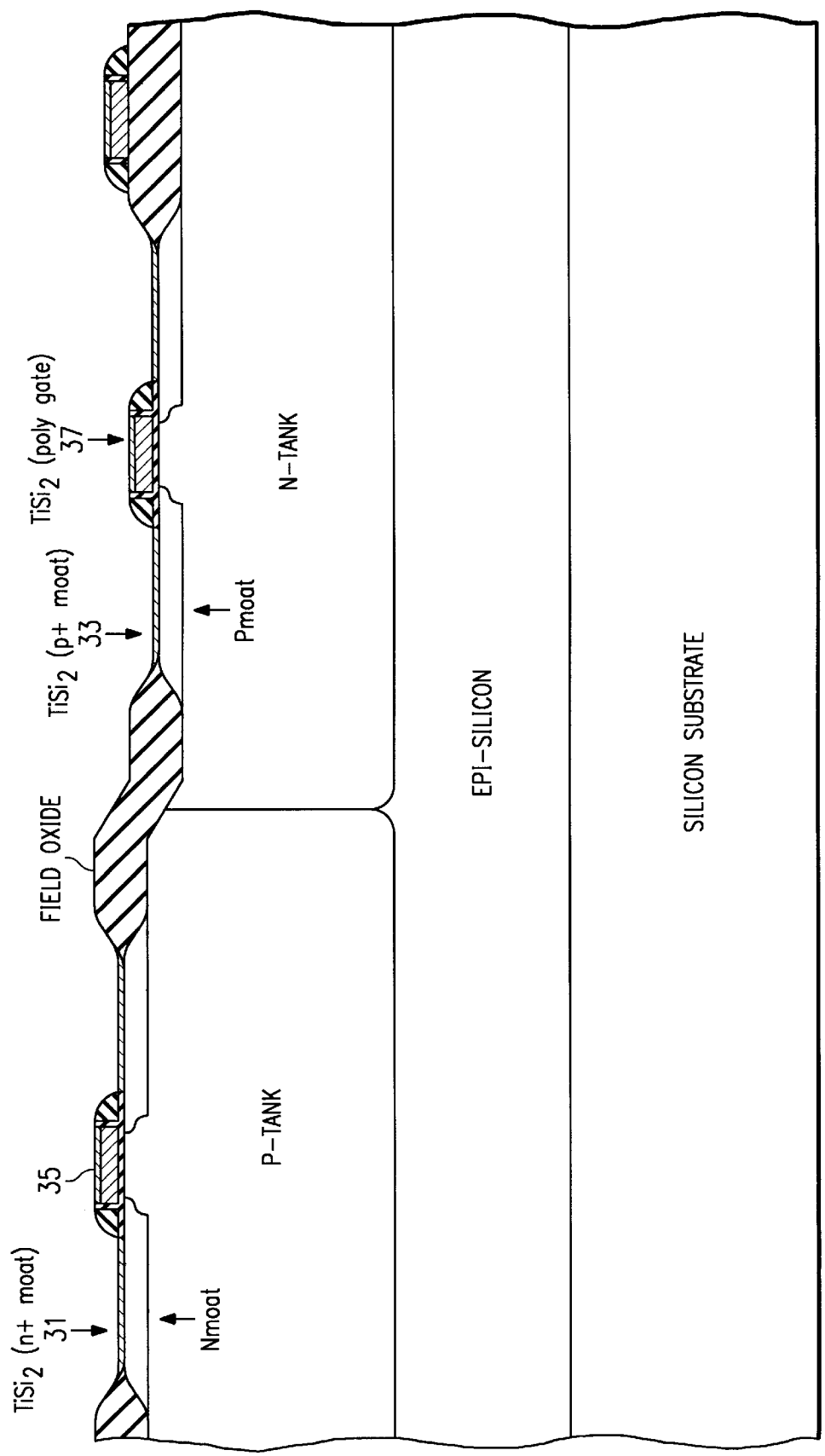
FIG. 1 is a cross sectional view of a typical partially fabricated prior art CMOS device.
Figure 2:
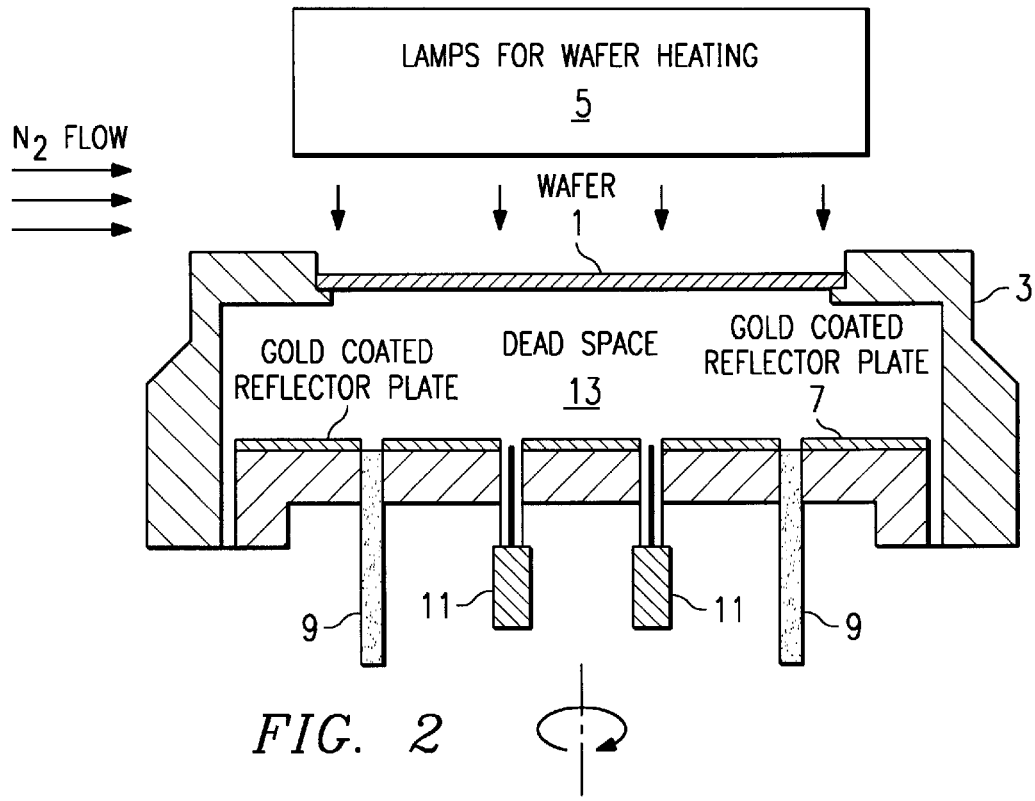
FIG. 2 is a schematic diagram of a typical rapid thermal processor in accordance with the prior art.
Figure 4:
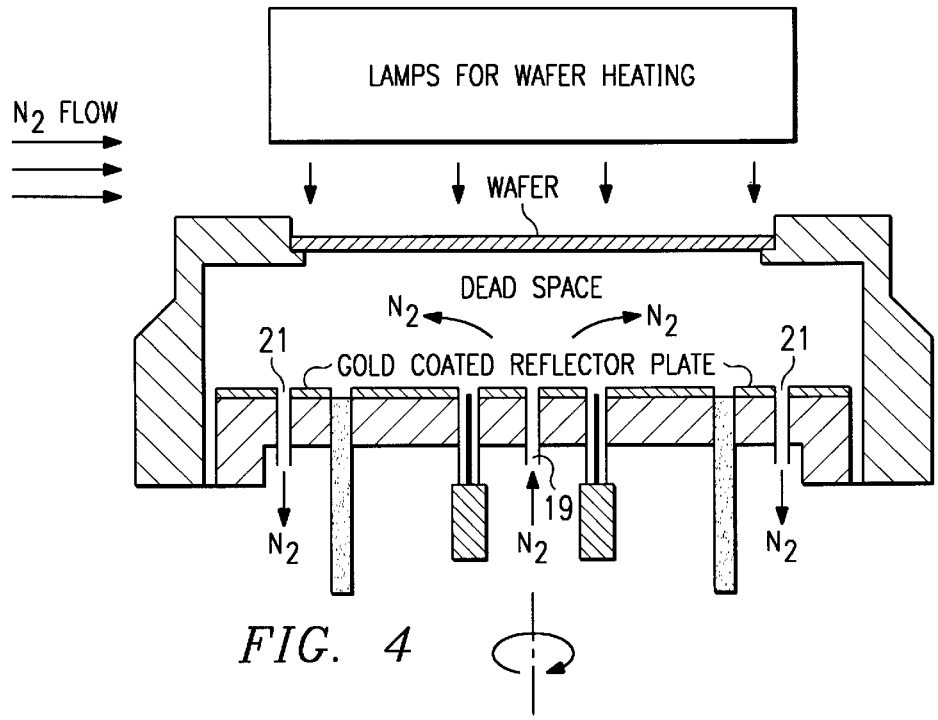
FIG. 4 is a schematic diagram in accordance with a second embodiment in accordance with the present invention.

Referring to FIG. 4, there is shown a second embodiment of the invention which is identical to the prior art of FIG. 2 except that a second source of inert gas, such as, for example, nitrogen, enters the dead space 13 through an opening 19 in the reflector plate 7, circulates in the dead space to purge the dead space and then exits with any collected moisture through outlets 21 in the reflector plate which are spaced apart to insure that the inert gas traverses the entire dead space.

Figure 5:
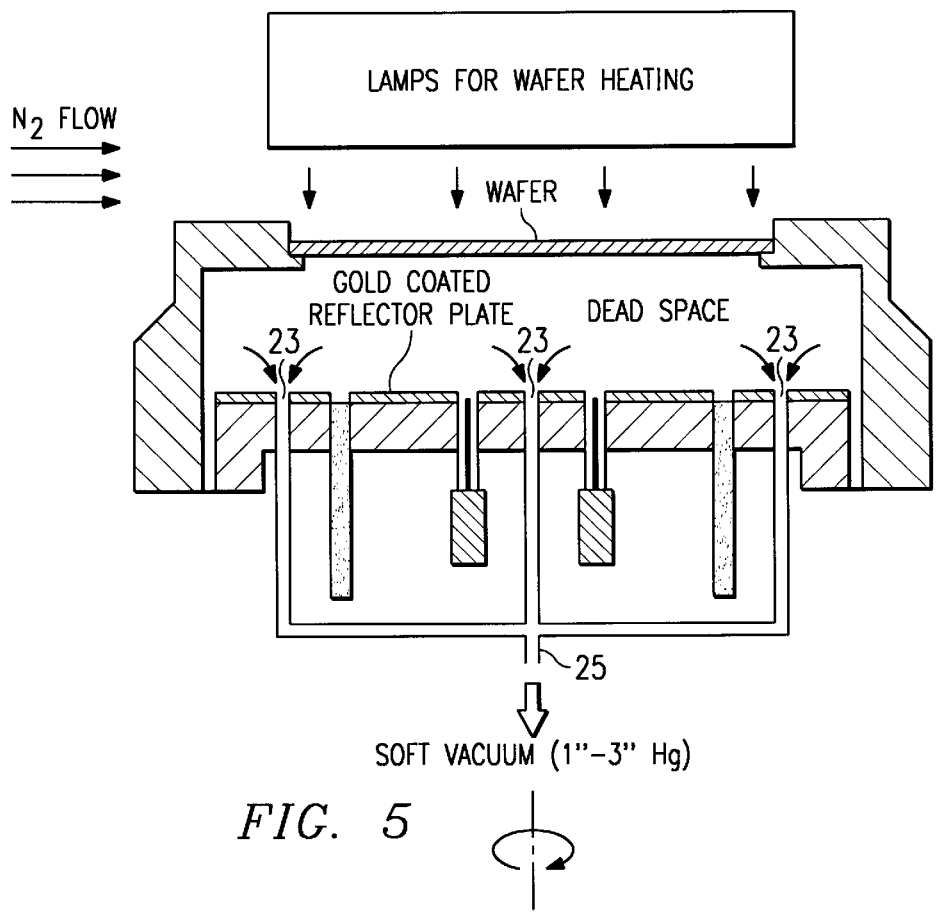
FIG. 5 is a schematic diagram in accordance with a third embodiment in accordance with the present invention.

Referring to FIG. 5, there is shown a third embodiment of the invention wherein the prior art RTP is modified by having a soft vacuum 25 of from about 1 to about 3 inches of mercury applied at various apertures 23 located radially symmetrically along the reflector plate 7.

Figure 6:
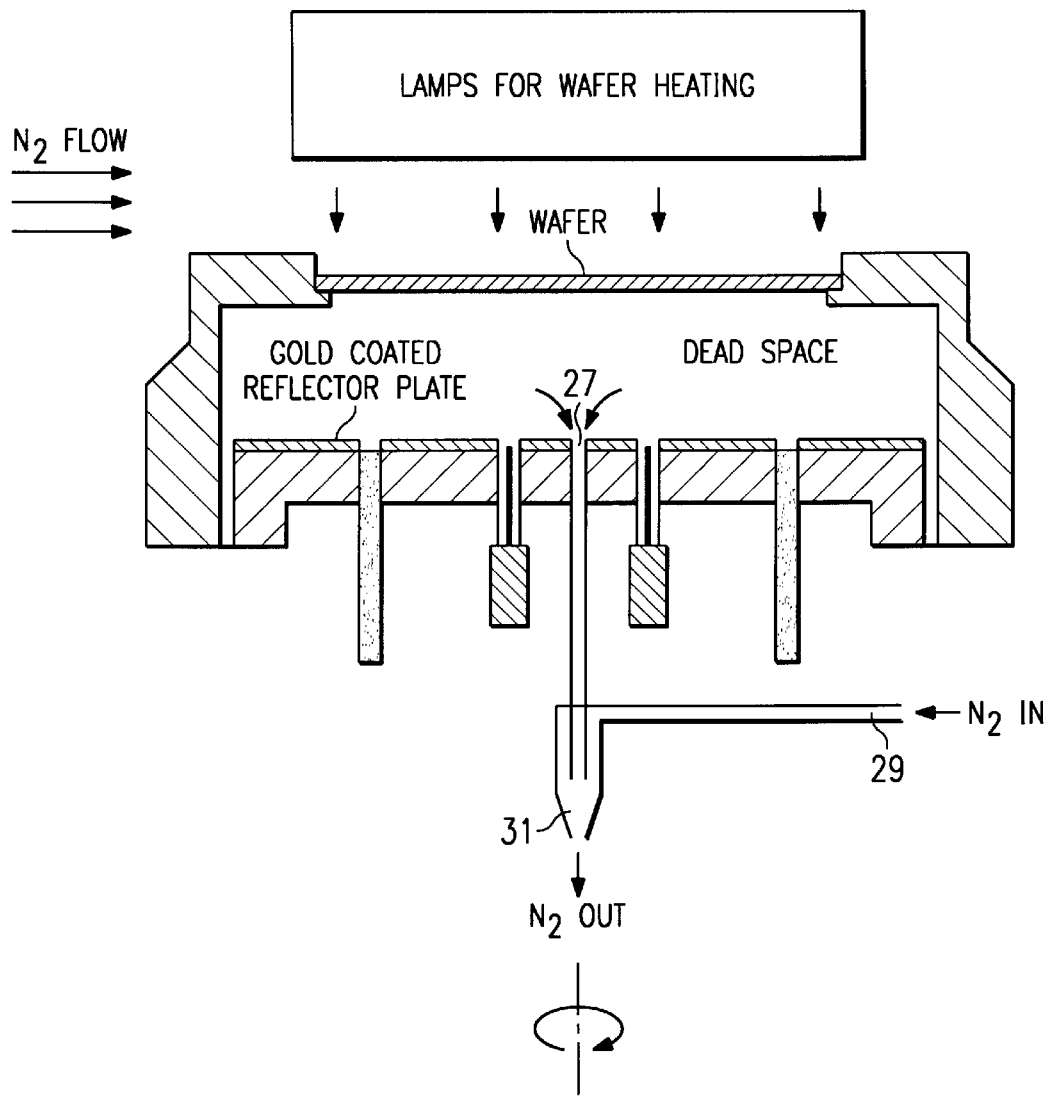
FIG. 6 is a schematic diagram in accordance with a fourth embodiment in accordance with the present invention.

Referring to FIG. 6, there is shown a fourth embodiment of the invention wherein the RTP of the prior art is modified by placing an outlet 27 in the reflector plate 7 and then applying an inert gas 29, preferably a slip stream of nitrogen from the chamber exhaust line, at the terminus of the outlet to provide a Venturi effect and thereby evacuate the dead space 13 including any moisture therein.

In accordance with the present invention, major moisture contamination is almost eliminated within the reactor, more uniform heating of the wafer backside is obtained and there is less energy loss due to infra red absorption by moisture molecules.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. In the procedure of thermal processing of semiconductor wafers during device fabrication on said wafer, the steps of:
   (a) providing a processing chamber for thermal processing of a semiconductor wafer having a component-containing surface and an opposing backside;
   (b) providing retaining means for said wafer within said chamber whereby said wafer, when retained by said retaining means, forms an enclosed space in said chamber with said backside; and
   (c) continually removing the fluid content of said enclosed space while said wafer is in said processing chamber.

2. The procedure of claim 1 wherein said step of continually removing comprises the step of purging said enclosed space with a moving gas inert to the materials in said chamber.

3. The procedure of claim 1 wherein said step of continually removing comprises the application of a vacuum to said enclosed space.

4. The procedure of claim 3 wherein said vacuum is formed by providing a Venturi.

5. The procedure of claim 1 further including the step of continually passing a gas inert to the materials in said chamber over said component-containing surface.

6. The procedure of claim 2 further including the step of continually passing a gas inert to the materials in said chamber over said component-containing surface.

7. The procedure of claim 3 further including the step of continually passing a gas inert to the materials in said chamber over said component-containing surface.

8. The procedure of claim 4 further including the step of continually passing a gas inert to the materials in said chamber over said component-containing surface.

9. A method of thermal processing of semiconductor wafers during device fabrication on said wafer, comprising the steps of:
   (a) providing a processing chamber for thermal processing of a semiconductor wafer having a component-containing surface and an opposing backside;
   (b) providing retaining means for said wafer within said chamber whereby said wafer, when retained by said retaining means, forms an enclosed space in said chamber with said backside;
   (c) retaining a wafer in said chamber with said retaining means and heating said wafer; and
   (d) concurrently with said heating said wafer continually removing the fluid content of said enclosed space while said wafer is in said processing chamber.

10. The method of claim 9 further including the step of removing said wafer from said chamber while concurrently continuing to remove the fluid content of said space which was said enclosed space.

11. The method of claim 10 wherein said step of continually removing comprises the step of purging said enclosed space with a moving gas inert to the materials in said chamber.

12. The method of claim 10 wherein said step of continually removing comprises the application of a vacuum to said enclosed space.

13. The method of claim 12 wherein said vacuum is formed by providing a Venturi.

14. The method of claim 10 further including the step of continually passing a gas inert to the materials in said chamber over said component-containing surface.

15. The method of claim 11 further including the step of continually passing a gas inert to the materials in said chamber over said component-containing surface.

16. The method of claim 12 further including the step of continually passing a gas inert to the materials in said chamber over said component-containing surface.

17. The method of claim 13 further including the step of continually passing a gas inert to the materials in said chamber over said component-containing surface.

\* \* \* \* \*